United States Patent
Haaβ et al.

(10) Patent No.: US 8,785,762 B2
(45) Date of Patent: Jul. 22, 2014

(54) SELF-ORGANISING THERMOELECTRIC MATERIALS

(75) Inventors: Frank Haaβ, Erzhausen (DE); Jan Dieter König, Freiburg (DE)

(73) Assignee: BASF SE, Ludwigshafen (DE)

( * ) Notice: Subject to any disclaimer, the term of this patent is extended or adjusted under 35 U.S.C. 154(b) by 406 days.

(21) Appl. No.: 13/259,454

(22) PCT Filed: Mar. 23, 2010

(86) PCT No.: PCT/EP2010/053762
§ 371 (c)(1),
(2), (4) Date: Sep. 23, 2011

(87) PCT Pub. No.: WO2010/108912
PCT Pub. Date: Sep. 30, 2010

(65) Prior Publication Data
US 2012/0001117 A1    Jan. 5, 2012

(30) Foreign Application Priority Data
Mar. 24, 2009    (EP) .................................... 09156007

(51) Int. Cl.
H01L 35/16    (2006.01)
(52) U.S. Cl.
USPC ..................... 136/238; 252/62.3 T
(58) Field of Classification Search
CPC ..................................................... H01L 35/16
USPC ..................... 136/238; 252/62.3 T
See application file for complete search history.

(56) References Cited

U.S. PATENT DOCUMENTS

| | | |
|---|---|---|
| 5,439,528 A | 8/1995 | Miller |
| 5,448,109 A | 9/1995 | Cauchy |
| 6,444,894 B1 | 9/2002 | Sterzel |
| 7,465,871 B2 * | 12/2008 | Chen et al. ................. 136/236.1 |
| 2005/0284512 A1 * | 12/2005 | Heremans et al. ......... 136/236.1 |
| 2006/0272697 A1 * | 12/2006 | Kanatzidis et al. ........... 136/238 |
| 2008/0295879 A1 * | 12/2008 | Atanackovic ................. 136/238 |
| 2009/0084422 A1 * | 4/2009 | Haass ........................... 136/204 |
| 2010/0282285 A1 | 11/2010 | Kuehling et al. |
| 2011/0012069 A1 | 1/2011 | Haass |
| 2011/0020164 A1 * | 1/2011 | Stefan et al. .................... 419/45 |
| 2011/0023930 A1 | 2/2011 | König et al. |
| 2011/0306261 A1 | 12/2011 | Haaβ |
| 2012/0017963 A1 * | 1/2012 | Stefan et al. .................. 136/203 |

FOREIGN PATENT DOCUMENTS

| | | |
|---|---|---|
| EP | 1102334 | 5/2001 |
| EP | 1187230 | 3/2002 |
| WO | WO-98/44562 | 10/1998 |
| WO | WO-2006/085929 | 8/2006 |
| WO | WO-2006/133031 | 12/2006 |
| WO | WO 2007104601 A2 * | 9/2007 |

OTHER PUBLICATIONS

"PCT International Preliminary Report on Patentability in German for PCT/EP2010/53762", Nov. 17, 2011, 13 pages.
"PCT International Search Report for PCT/EP2010/053762", Aug. 4, 2011, 7 pages.
Faleev, Sergey V. et al., "Theory of Enhancement of Thermoelectric Properties of Materials with Nanoinclusions", *Physical Review B 77* 2008 , 214304-1 to 214304-9.
Ikeda, Teruyuki et al., "Self-Assembled Nanometer Lamellae of Thermoelectric PbTe and Sb2Te3 with Epitaxy-Like Interfaces", *Chem. Mater.*, vol. 19 2006 , 763-767.
Ikeda, Teruyuki et al., "Solidification Processing of Alloys in the Pseudo-Binary PbTe-Sb2Te3 System", *Acta Materialia*, vol. 55.No. 4 2007 , 1227-1239.
"Translated IPRP of PCT/EP2010/053762", mailed on Feb. 16, 2012 , 7 pages.

* cited by examiner

Primary Examiner — Douglas McGinty
(74) Attorney, Agent, or Firm — Servilla Whitney LLC

(57) ABSTRACT

In a process for producing thermoelectric materials with a polyphasic structure, in which particles of a first phase with a characteristic length of not more than 10 μm are present in homogeneous dispersion in a second phase, by self-assembly, an a least binary thermoelectric material is melted together with a metal which is not a component of the at least binary thermoelectric material, or a chalcogenide of said metal, and, after mixing, is cooled or bonded by reactive grinding.

8 Claims, No Drawings

SELF-ORGANISING THERMOELECTRIC MATERIALS

CROSS-REFERENCE TO RELATED APPLICATIONS

This application is the National Stage entry of PCT/EP2010/053762, filed on Mar. 23, 2010, which claims priority to European Patent application number 09156007.8, filed on Mar. 24, 2009, both of which are incorporated herein by reference in their entireties.

The present invention relates to processes for producing thermoelectric materials with a polyphasic structure by self-assembly, to thermoelectric materials obtainable by the processes, to thermoelectric generators or Peltier arrangements comprising them, and to the use thereof.

Thermoelectric generators and Peltier arrangements as such have been known for some time. p- and n-doped semiconductors which are heated on one side and cooled on the other side transport electrical charges through an external circuit, and electrical work can be performed by a load in the circuit. The efficiency of conversion of heat to electrical energy achieved in this process is limited thermodynamically by the Carnot efficiency. Thus, at a temperature of 1000 K on the hot side and 400 K on the "cold" side, an efficiency of (1000-400):1000=60% would be possible. However, only efficiencies of up to 6% have been achieved to date.

On the other hand, when a direct current is applied to such an arrangement, heat is transported from one side to the other side. Such a Peltier arrangement works as a heat pump and is therefore suitable for cooling apparatus parts, vehicles or buildings. Heating via the Peltier principle is also more favorable than conventional heating, because more heat is always transported than corresponds to the energy equivalent supplied.

A good review of effects and materials is given, for example, by the MRS Bulletin Harvesting Energy through Thermoelectrics:Power Generation and Cooling, No. 31(3), 2006.

At present, thermoelectric generators are used, for example, in space probes for gene-rating direct currents, for cathodic corrosion protection of pipelines, for energy supply to light buoys and radio buoys and for operating radios and television sets. The advantages of thermoelectric generators lie in their extreme reliability. For instance, they work irrespective of atmospheric conditions such as atmospheric moisture; there is no fault-prone mass transfer, but rather only charge transfer. It is possible to use any fuels from hydrogen through natural gas, gasoline, kerosene, diesel fuel up to biologically obtained fuels such as rapeseed oil methyl ester.

Thermoelectric energy conversion thus fits extremely flexibly into future requirements such as hydrogen economy or energy generation from renewable energies.

A particularly attractive application is the use for converting (waste) heat to electrical energy in motor vehicles, heating systems or power plants. Thermal energy unutilized to date can even now be recovered at least partly by thermoelectric generators, but existing technologies achieve efficiencies of significantly below 10%, and so a large part of the energy is still lost unutilized. In the utilization of waste heat, there is therefore also a drive toward significantly higher efficiencies.

The conversion of solar energy directly to electrical energy would also be very attractive. Concentrators such as parabolic troughs can concentrate solar energy into thermoelectric generators, which generates electrical energy.

However, higher efficiencies are also needed for use as a heat pump.

Thermoelectrically active materials are rated essentially with reference to their efficiency. A characteristic of thermoelectric materials in this regard is what is known as the Z factor (figure of merit):

$$Z = \frac{S^2 \cdot \sigma}{\kappa}$$

with the Seebeck coefficient S, the electrical conductivity 6 and the thermal conductivity κ. Preference is given to thermoelectric materials which have a very low thermal conductivity, a very high electrical conductivity and a very large Seebeck coefficient, such that the figure of merit assumes a maximum value.

The product $S^2\sigma$ is referred to as the power factor and serves for comparison of the thermoelectric materials.

In addition, the dimensionless product Z·T is often also reported for comparative purposes. Thermoelectric materials known hitherto have maximum values of Z·T of about 1 at an optimal temperature. Beyond this optimal temperature, the values of Z·T are often significantly lower than 1.

A more precise analysis shows that the efficiency η is calculated from $$\eta = \frac{T_{high} - T_{low}}{T_{high}} \frac{M - 1}{M + \frac{T_{low}}{T_{high}}}$$

where $$M = \left[1 + \frac{Z}{2}(T_{high} + T_{low})\right]^{\frac{1}{2}}$$

(see also Mat. Sci. and Eng. B29 (1995) 228).

The aim is thus to provide a thermoelectrically active material having a maximum value of Z and a high realizable temperature differential. From the point of view of solid state physics, many problems have to be overcome here:

A high σ requires a high electron mobility in the material, i.e. electrons (or holes in p-conducting materials) must not be bound strongly to the atomic cores. Materials having high electrical conductivity a usually simultaneously have a high thermal conductivity (Wiedemann-Franz law), which does not allow Z to be favorably influenced. Materials used at present, such as $Bi_2Te_3$, already constitute compromises. For instance, the electrical conductivity is lowered to a lesser extent by alloying than the thermal conductivity. Preference is therefore given to using alloys, for example $(Bi_2Te_3)_{90}(Sb_2Te_3)_5(Sb_2Se_3)_5$ or $Bi_{12}Sb_{23}Te_{65}$, as described in U.S. Pat. No. 5,448,109.

For thermoelectric materials having high efficiency, still further boundary conditions preferably have to be fulfilled. For instance, they have to be sufficiently thermally stable to be able to work under operating conditions over the course of years without significant loss of efficiency. This requires a phase which is thermally stable at high temperatures per se, a stable phase composition, and negligible diffusion of alloy constituents into the adjoining contact materials.

The thermoelectric efficiency can be improved by increasing the Seebeck coefficient or the electrical conductivity, but also by reducing the thermal conductivity by suitable structuring of the materials.

Self-assembly within the bulk materials makes it possible to form polyphasic structures, which allows the thermal conductivity of solids to be reduced significantly, since the polyphasic structures greatly prevent the spread of phonons by scatter. Such structures, which are preferably present in a size dimension in the low micrometer to nanometer range, can be improved according to the thermoelectric properties of the materials.

The thermal conductivity is reduced by scattering the phonons on the polyphasic structures in the thermoelectric material. At the same time, the Seebeck coefficient of the material can remain constant or even be increased further as a result of scatter of the electrons at the electrical potential of the inclusions or the self-assembly structures. A low electrical contact resistance between the matrix material and the material of the self-assembly structures is advantageous, in order that the electrical conductivity is not significantly reduced by the structuring. The material itself, of which the self-assembly structures consist, should thus only insignificantly, if at all, impair the thermoelectric properties of the matrix material.

Examples of such self-assembly systems are already known. WO 2006/133031 describes a process for producing thermoelectric bulk materials with inclusions in the nanometer range. This involves first forming a liquid solution of a first chalcogenide as a matrix and of a second chalcogenide as an inclusion material, the structuring being effected by rapid cooling. Suitable example compositions are specified in table 1 of WO 2006/133031.

Physical Review B 77, 214304 (2008), pages 214304-1 to 214304-9, describes the inclusion of metallic nanoparticles into thermoelectric materials. However, only model calculations are presented.

Lamellar structures based on PbTe and $Sb_2Te_3$ are described in Chem. Mater. 2007, 19, pages 763-767. They are produced by rapidly cooling a composition which is close to a eutectic mixture.

Acta Materialia 55 (2007), pages 1227 to 1239, also describes the production of pseudo-binary PbTe—$Sb_2Te_3$ systems which have a nanostructure. Different methods of cooling to form the self-assembly systems are described.

SUMMARY

An aspect of the invention pertains to a process for producing thermoelectric materials with a polyphasic structure, in which particles of a first phase with a characteristic length, a measure of the mean geometric dimension of the particles within the matrix, of not more than 10 μm are present in homogeneous dispersion in a second phase, so that particles of the first phase or the first phase with the characteristic length are present distributed in the second phase such that the particles of the first phase are not in contact and, in macroscopic terms, there is homogeneous distribution over the entire matrix material, by self-assembly, which comprises melting an at least binary thermoelectric material together with a metal which is not a component of the at least binary thermoelectric material, or a chalcogenide of said metal, and, after mixing, cooling or bonding by means of reactive grinding, and wherein the thermoelectric material and the metal have the general formula (I):

$$(A^{IV}B^{VI})_{1-x}Me_x \qquad (I)$$

where
$A^{IV}$ is Si, Ge, Sn, Pb or a combination thereof,
$B^{VI}$ is S, Se, Te or a combination thereof,
Me is Ta, Nb, Mo, W, Ni, Pd, Pt, Ti, Zr, Hf, Fe, Co or a combination thereof,
1 ppm<x<0.8, or wherein the thermoelectric material and the metal have the general formula (II)

$$(C^V_2B^{VI}_3)_{1-x}Me_x \qquad (II)$$

where
$C^V$ is P, As, Sb, Bi or a combination thereof,
$B^{VI}$ is S, Se, Te or a combination thereof,
Me is Ta, Nb, Mo, W, Ni, Pd, Pt, Au, Ag, Cu, Ti, Zr, Hf, V, Cr, Mn, Fe, Ru, Os, Co, Rh, Ir, In, Ga, Al, Zn, Cd, Tl or a combination thereof,
1 ppm<x<0.8, or wherein the thermoelectric material and the metal chalcogenide have the general formula (III)

$$(A^{IV}B^{VI})_{1-x}(MeB^{VI}_b)_x \qquad (III)$$

where
$A^{IV}$ is Si, Ge, Sn, Pb or a combination thereof,
$B^{VI}$ is S, Se, Te or a combination thereof,
Me is Ta, Nb, Mo, W, Ni, Pd, Pt, Ti, Zr, Hf, Fe, Co or a combination thereof,
1 ppm<x<0.8 and 0<b<3, or wherein the thermoelectric material and the metal chalcogenide have the general formula (IV)

$$C^V_2B^{VI}_3)_{1-x}(MeB^{VI}_b)_x \qquad (IV)$$

where
$C^V$ is P, As, Sb, Bi or a combination thereof,
$B^{VI}$ is S, Se, Te or a combination thereof,
Me is Ta, Nb, Mo, W, Ni, Pd, Pt, Au, Ag, Cu, Ti, Zr, Hf, V, Cr, Mn, Fe, Ru, Os, Co, Rh, Ir, In, Ga, Al, Zn, Cd, Tl or a combination thereof,
1 ppm<x<0.8 and
0<b<3.

In various embodiments of the first aspect, the particles of the first phase have a characteristic length of not more than 1 μm or more specifically not more than 0.1 μm, and the proportion of the metals or metal chalcogenides of the first phase is 5 to 60 atom%, based on the overall thermoelectric material and the entire thermoelectric material is free of silver. Other aspects relate to a thermoelectric material, a thermoelectric generator or Peltier arrangement, heat pump, cooler, refrigerator, (laundry) dryer, generator for utilizing heat sources, generator for converting thermal energy to electrical energy utilizing the thermoelectric materials.

DETAILED DESCRIPTION

Embodiments of the present invention provide processes for producing thermoelectric materials with a polyphasic structure by self-assembly, which lead to the formation of thermoelectric materials with reduced thermal conductivity.

One or more embodiments provide a process for producing thermoelectric materials with a polyphasic structure, in which particles of a first phase are present in homogeneous dispersion in a second phase, by self-assembly, wherein an at least binary thermoelectric material is melted together with a metal which is not a component of the at least binary thermoelectric material, or a chalcogenide of said metal, and, after mixing, is cooled or alloyed by reactive grinding.

The "characteristic length" typically used to describe heterogeneous and polyphasic materials can, in the case of spherical or approximately spherical inclusions, also be expressed as the mean particle diameter. When the particles, however, deviate significantly from the spherical form and have a greater longitudinal dimension in one spatial direction, the characteristic length is a measure of the mean geometric dimension of the particles within the matrix. The length can be determined by microscopy with measurement and counting of the inclusions or particles.

The particles of the first phase preferably have a characteristic length of not more than 1 μm, more preferably not more than 0.1 μm, provided that they are spherical or virtually spherical. In the case of particles with a large aspect ratio, however, the dimension in one spatial direction may quite possibly be up to 100 μm.

It has been found in accordance with the invention that self-assembly in the production of thermoelectric materials is possible when the materials used for the particulate phase or inclusion phase are metals or metal chalcogenides, more preferably metals. Normally, it will be assumed that metallic inclusions lead to increased thermal conductivity. However, it has been found in accordance with the invention that the metallic inclusions greatly hinder the spread of phonons as a result of scatter and hence greatly reduce the thermal conductivity of the materials. This allows better thermoelectric qualities or efficiencies to be achieved. An elongated (rod-shaped) geometry of the first phase allows anisotropy of the thermoelectric properties to be achieved.

Overall, this only insignificantly, if at all, impairs the thermoelectric properties of the matrix material. There is only a small electrical contact resistance between the matrix material and the material of the self-assembly structures (inclusion material), such that the electrical conductivity is not reduced significantly by the structuring. The Seebeck coefficient of the material may remain constant or even be increased even further.

According to the invention, polyphasic structures, preferably biphasic structures, are formed. The first phase is dispersed homogeneously in the second phase. The term "homogenously dispersed" indicates that particles of the first phase or the first phase with the characteristic length are present distributed in the second phase such that the particles of the first phase are not in contact and, in macroscopic terms, there is homogeneous distribution over the entire matrix material. There are thus no significant local accumulations or concentration increases in the first phase, but rather, viewed macroscopically, there is a homogeneous distribution in the overall matrix. The first phase is, however, not dissolved in the second phase, but is instead present in a more or less ordered arrangement in the form of particles or phases in the micrometer or nanometer range. The distances from each particle to its next surrounding particles are preferably essentially the same. The figures give further explanation of the term "homogeneous dispersion". Homogeneous dispersion also means that no separation of the two phases in the material is discernible to the naked eye.

In one embodiment of the invention, the thermoelectric material and the metal have the general formula (I)

$$(A^{IV}B^{VI})_{1-x}Me_x \quad (I)$$

where
$A^{IV}$ is Si, Ge, Sn, Pb or a combination thereof,
$B^{VI}$ is S, Se, Te or a combination thereof,
Me is Ta, Nb, Mo, W, Ni, Pd, Pt, Au, Ag, Cu, Ti, Zr, Hf, V, Cr, Mn, Fe, Ru, Os, Co, Rh, Ir, In, Ga, Al, Zn, Cd, Tl or a combination thereof,
1 ppm<x<0.8.

In a further embodiment of the invention, the thermoelectric material and the metal have the general formula (II)

$$(C^V_2B^{VI}_3)_{1-x}Me_x \quad (II)$$

where
$C^V$ is P, As, Sb, Bi or a combination thereof,
$B^{VI}$ is S, Se, Te or a combination thereof,
Me is Ta, Nb, Mo, W, Ni, Pd, Pt, Au, Ag, Cu, Ti, Zr, Hf, V, Cr, Mn, Fe, Ru, Os, Co, Rh, Ir, In, Ga, Al, Zn, Cd, Tl or a combination thereof,
1 ppm<x<0.8.

In one embodiment of the invention, the thermoelectric material and the metal chalcogenide have the general formula (III)

$$(A^{IV}B^{VI})_{1-x}(MeB^{VI}_b)_x \quad (III)$$

where
$A^{IV}$ is Si, Ge, Sn, Pb or a combination thereof,
$B^{VI}$ is S, Se, Te or a combination thereof,
Me is Ta, Nb, Mo, W, Ni, Pd, Pt, Au, Ag, Cu, Ti, Zr, Hf, V, Cr, Mn, Fe, Ru, Os, Co, Rh, Ir, In, Ga, Al, Zn, Cd, Tl or a combination thereof,
1 ppm<x<0.8 and
0<b<3.

In a further embodiment of the invention, the thermoelectric material and the metal chalcogenide have the general formula (IV)

$$(C^V_2B^{VI}_3)_{1-x}(MeB^{VI}_b)_x \quad (IV)$$

where
$C^V$ is P, As, Sb, Bi or a combination thereof,
$B^{VI}$ is S, Se, Te or a combination thereof,
Me is Ta, Nb, Mo, W, Ni, Pd, Pt, Au, Ag, Cu, Ti, Zr, Hf, V, Cr, Mn, Fe, Ru, Os, Co, Rh, Ir, In, Ga, Al, Zn, Cd, Tl or a combination thereof,
1 ppm<x<0.8 and
0<b<3.

The proportion of the metals or metal chalcogenides of the first phase is, based on the overall thermoelectric material, preferably 5 to 60 atom %, more preferably 5 to 30 atom %. The index x thus preferably has the value of 0.05 to 0.6, more preferably 0.05 to 0.30.

In one embodiment of the invention, the entire thermoelectric material is free of silver, and so the radicals in the formulae (I) to (IV) are not silver.

In the structures of the general formula (I), $A^{IV}$ is preferably Sn, Pb or a combination thereof, more preferably Pb. $B^{VI}$ is preferably Se, Te or a combination thereof, more preferably Te. Me is preferably Ta, Nb, Mo, W, Ni, Pd, Pt, Ti, Zr, Hf, Fe, Co or a combination thereof, more preferably Ni, Pd, Pt, Ti, Zr, Hf, Fe, Co or a combination thereof, especially Fe.

In the thermoelectric material of the general formula (II), $C^V$ is preferably Sb, Bi or a combination thereof, especially Bi. $B^{VI}$ is more preferably Te. Me is preferably Fe or Ni or a combination thereof, more preferably Fe.

The inventive materials can preferably be prepared from the following starting materials:
$A^{IV}_x+B^{VI}_{x+y}+Me_z$;
$A^{IV}_BVI_y+Me_z$;
$C^V_q+B^{VI}_{3+r}+Me_s$ and
$C^V_2+B^{VI}_{3+r}+Me_s$; in each case plus dopants;
$A^{IV}$:Si, Ge, Sn, Pb or a combination thereof;
$B^{VI}$:S, Se, Te or a combination thereof;
$C^V$:P, As, Sb, Bi or a combination thereof;
Me:Ta, Nb, Mo, W, Ni, Pd, Pt, Au, Ag, Cu, Ti, Zr, Hf, V, Cr, Mn, Fe, Ru, Os, Co, Rh, Ir, In, Ga, Al, Zn, Cd, Tl or a combination thereof.

The inventive materials are generally produced by reactive grinding or preferably by co-melting and reaction of mixtures of the particular elemental constituents or alloys thereof. In general, a reaction time for the reactive grinding or preferably co-melting of at least one hour has been found to be advantageous.

The co-melting and reaction is effected preferably over a period of at least 1 hour, more preferably at least 6 hours, especially at least 10 hours. The melting process can be effected with or without mixing of the starting mixture. When the starting mixture is mixed, suitable apparatus for this purpose is especially a rotary or tilting oven, in order to ensure the homogeneity of the mixture.

If no mixing is undertaken, longer melting times are generally required in order to obtain a macroscopically homogeneous material. If mixing is undertaken, macroscopic homogeneity in the mixture is obtained at an earlier stage.

Without additional mixing of the starting materials, the melting time is generally 2 to 50 hours, especially 30 to 50 hours.

The co-melting is effected generally at a temperature at which at least one constituent of the mixture has already melted. In general, the melting temperature is at least 800° C., preferably at least 950° C. Typically, the melting temperature is within a temperature range from 800 to 1100° C., preferably from 950 to 1050° C.

The cooling of the molten mixture is advantageously followed by the heat treatment of the material at a temperature of generally at least 100° C., preferably at least 200° C., lower than the melting point of the resulting semiconductor material. Typically, the temperature is 450 to 750° C., preferably 550 to 700° C.

The heat treatment is preferably carried out over a period of at least 1 hour, more preferably at least 2 hours, especially at least 4 hours. Typically, the heat treatment time is 1 to 8 hours, preferably 6 to 8 hours. In one embodiment of the present invention, the heat treatment is performed at a temperature which is 100 to 500° C. lower than the melting temperature of the resulting semiconductor material. A preferred temperature range is 150 to 350° C. lower than the melting temperature of the resulting semiconductor material.

The inventive thermoelectric materials are prepared generally in an evacuated and sealed quartz tube. Mixing of the components involved can be ensured by use of a rotatable and/or tiltable oven. On completion of the reaction, the oven is cooled. Thereafter, the quartz tube is removed from the oven and the semiconductor material is isolated from the reaction vessel.

Instead of a quartz tube, it is also possible to use tubes or ampoules of other materials which are inert with respect to the semiconductor material, for example of tantalum.

Instead of tubes, it is also possible to use other vessels of a suitable shape. It is also possible to use other materials, for example graphite, as the vessel material, provided that they are inert with respect to the semiconductor material. The materials can also be synthesized by melting/co-melting in an induction oven, for example in graphite crucibles.

In one embodiment of the present invention, the cooled material can be ground wet, dry or in another suitable manner, at a suitable temperature, such that the inventive semiconductor material is obtained in customary particle sizes of less than 10 µm. The ground inventive material is then extruded hot or cold or preferably compressed hot or cold to moldings having the desired form. The density of the moldings pressed in this way should preferably be greater than 50%, more preferably greater than 80%, of the density of the crude material in the unpressed state. Compounds which improve the compaction of the inventive material may be added in amounts of preferably 0.1 to 5% by volume, more preferably 0.2 to 2% by volume, based in each case on the powdered inventive material. Additives which are added to the inventive materials should preferably be inert toward the semiconductor material and preferably be discharged from the inventive material during the heating to temperatures below the sintering temperature of the inventive materials, if appropriate under inert conditions and/or reduced pressure. After the pressing, the pressed parts are preferably introduced into a sintering oven in which they are heated to a temperature of preferably not more than 20° C. below the melting point.

The pressed parts are sintered at a temperature of generally at least 100° C., preferably at least 200° C., lower than the melting point of the resulting semiconductor material.

The sintering temperature for IV-VI semiconductors is typically 750° C., preferably 600 to 700° C. For V-VI semiconductors, the sintering temperatures are usually lower. It is also possible to carry out spark plasma sintering (SPS) or microwave sintering.

The sintering is performed over a period of preferably at least 0.5 hour, more preferably at least 1 hour, in particular at least 2 hours. Typically, the sintering time is 0.5 to 500 hours, preferably 1 to 50 hours. In one embodiment of the present invention, the sintering is performed at a temperature which is 100 to 600° C. lower than the melting temperature of the resulting semiconductor material. A preferred temperature range is 150 to 350° C. lower than the melting point of the resulting semiconductor material. The sintering is preferably performed in a reducing atmosphere, for example under hydrogen, or a protective gas atmosphere, for example of argon.

The pressed parts are thus sintered preferably to 95 to 100% of their theoretical bulk density.

Overall, this gives rise, as a preferred embodiment of the present process according to the invention, to a process which comprises the following process steps:

(1) co-melting mixtures of the particular elemental constituents or alloys thereof with the at least quaternary or ternary compound;
(2) grinding the material obtained in process step (1);
(3) pressing or extruding the material obtained in process step (2) to moldings and
(4) sintering the moldings obtained in process step (3).

In addition to the melt synthesis and reactive grinding, a rapid solidification process, for example a melt-spinning process, can be carried out. Mechanical alloying of the reactant powders (elements or prealloyed constituents) under pressure and/or elevated temperature is also possible.

Any of the production steps described may be followed by one or more processing steps, proceeding either directly from a fusion product or comminuted fusion products or a powder or material obtained by pulverization. Further processing steps may, for example, be hot pressing or cold pressing, spark plasma sintering (SPS), sintering or heat treatment, hot or cold extrusion or microwave sintering, some of which have already been described above.

The invention also relates to semiconductor materials obtainable or obtained, i.e. produced, by the processes according to the invention.

The present invention further provides for the use of the above-described semiconductor material and of the semiconductor material obtainable by the above-described process as a thermoelectric generator or Peltier arrangement.

The present invention further provides thermoelectric generators or Peltier arrangements which comprise the above-described semiconductor material and/or the semiconductor material obtainable by the above-described process.

The present invention further provides a process for producing thermoelectric generators or Peltier arrangements, in which thermoelectrically active legs connected in series are used with thin layers of the above-described thermoelectric materials.

The inventive semiconductor materials can be combined to form thermoelectric generators or Peltier arrangements by methods which are known per se to the person skilled in the art and are described, for example, in WO 98/44562, U.S. Pat. No. 5,448,109, EP-A-1 102 334 or U.S. Pat. No. 5,439,528.

The inventive thermoelectric generators or Peltier arrangements generally widen the available range of thermoelectric generators and Peltier arrangements. By varying the chemical composition of the thermoelectric generators or Peltier arrangements, it is possible to provide different systems which satisfy different requirements in a multitude of possible applications. The inventive thermoelectric generators or Peltier arrangements thus widen the range of application of these systems.

The present invention also relates to the use of an inventive thermoelectric generator or of an inventive Peltier arrangement as a heat pump
for climate control of seating furniture, vehicles and buildings
in refrigerators and (laundry) dryers
for simultaneous heating and cooling of streams in processes for substance separation such as
absorption
drying
crystallization
evaporation
distillation
as a generator for utilization of heat sources such as
solar energy
geothermal heat
heat of combustion of fossil fuels
waste heat sources in vehicles and stationary units
heat sinks in the evaporation of liquid substances
biological heat sources
for cooling electronic components
as a generator for converting thermal energy to electrical energy, for example in motor vehicles, heating systems or power plants.

The present invention further relates to a heat pump, to a cooler, to a refrigerator, to a (laundry) dryer, to a generator for converting thermal energy to electrical energy or to a generator for utilizing heat sources, comprising at least one inventive thermoelectric generator or one inventive Peltier arrangement.

The present invention is illustrated in detail with reference to the examples described below.

EXAMPLES

The materials which follow were prepared from the elements (purity≥99.99%). The elements were weighed in the particular stoichiometric ratio into a previously carefully cleaned quartz ampoule (Ø 10 mm). This was evacuated and sealed by melting. The ampoule was heated to 1050° C. at a heating rate of 40 K min$^{-1}$ and left at this temperature in the oven for 12 h. The material was mixed continuously by a seesaw motion of the oven. After the reaction time had elapsed, it was cooled to room temperature at a rate of 100 K min$^{-1}$. The fusion products were removed from the ampoules and sawn by means of a diamond wire saw into slices of thickness 1 mm to 2 mm, ground and polished, and were then characterized.

The material (n-PbTe)$_3$Fe was prepared in example 1.
The material (n-PbTe)$_3$Co was prepared in example 2.
The material PbTiTe was prepared in example 3.

The Seebeck coefficient was determined in parallel to the cross section of the sample slice by applying a temperature gradient of approx. 5 K to the slice, with a mean temperature of the sample of 310 K. The measured voltage at this temperature difference divided by the temperature difference between cold and hot contact provided the Seebeck coefficient reported in each case.

The electrical conductivity was determined at room temperature by a four-point measurement. This was done by the van de Pauw method in parallel to the sample cross section. The method is known to those skilled in the art.

The measurement of the thermal conductivity was effected at right angles to the sample cross section by means of the laser flash method. The method is known to those skilled in the art.

The thermoelectric properties at room temperature are compiled in the table below:

| Material | S/μV K-1 | [n]/cm$^{-3}$ | μ/cm$^2$ V$^{-1}$ s$^{-1}$ | σ/S cm$^{-1}$ | λ/W K$^{-1}$ m$^{-1}$ |
|---|---|---|---|---|---|
| Example 1 | −66.3 | 3.6 · 10$^{19}$ | 471 | 2700 | 4.329 |
| Example 2 | −46.9 | 1.1 · 10$^{20}$ | 302 | 4840 | 5.762 |
| Example 3 | 2.44 | 1.2 · 10$^{23}$ | 0.5 | 9773 | n. a. |

It was to be expected that, owing to the metal content, a thermal conductivity close to the thermal conductivity of the metal is established. However, it was found in accordance with the invention that the thermal conductivity is significantly lower.

Moreover, the Seebeck coefficient and the electrical conductivity were not significantly worsened in examples 1 and 2, which was not to be expected in principle owing to the blending of metal (high electrical conductivity, low Seebeck coefficient) and constitutes a surprising result.

The invention claimed is:

1. A process for producing thermoelectric materials with a polyphasic structure, in which particles of a first phase with a characteristic length, a measure of the mean geometric dimension of the particles within the matrix, of not more than 10 μm are present in homogeneous dispersion in a second phase, so that particles of the first phase are present distributed in the second phase such that the particles of the first phase are not in contact and, in macroscopic terms, there is homogeneous distribution over the entire matrix material, by self-assembly, which comprises melting an at least binary thermoelectric material together with a metal which is not a component of the at least binary thermoelectric material, or a chalcogenide of said metal, and, after mixing, cooling or bonding by means of reactive grinding, and wherein the thermoelectric material and the metal have the general formula (I):

where
A$^{IV}$ is Si, Ge, Sn, Pb or a combination thereof,
B$^{VI}$ is S, Se, Te or a combination thereof,
Me is Ta, Nb, Mo, W, Ni, Pd, Pt, Ti, Zr, Hf, Fe, Co or a combination thereof,
1 ppm <x<0.8,
or wherein the thermoelectric material and the metal have the general formula (II)

where
C$^V$ is P, As, Sb, Bi or a combination thereof,
B$^{VI}$ is S, Se, Te or a combination thereof, Me is Ta, Nb, Mo, W, Ni, Pd, Pt, Au, Ag, Cu, Ti, Zr, Hf, V, Cr, Mn, Fe, Ru, Os, Co, Rh, Ir, In, Ga, Al, Zn, Cd, Tl or a combination thereof, 1 ppm<x<0.8, or wherein the thermoelectric material and the metal chalcogenide have the general formula (III)

$$(A^{IV}B^{VI})_{1-x}(MeB^{VI}_b)_x \quad \text{(III)}$$

where $A^{IV}$ is Si, Ge, Sn, Pb or a combination thereof,
$B^{VI}$ is S, Se, Te or a combination thereof,
Me is Ta, Nb, Mo, W, Ni, Pd, Pt, Ti, Zr, Hf, Fe, Co or a combination thereof, 1 ppm<x<0.8 and
0<b<3, or wherein the thermoelectric material and the metal chalcogenide have the general formula (IV)

$$(C^{V}_2B^{VI}_3)_{1-x}(MeB^{VI}_b)_x \quad \text{(IV)}$$

where $C^{V}$ is P, As, Sb, Bi or a combination thereof,
$B^{VI}$ is S, Se, Te or a combination thereof,
Me is Ta, Nb, Mo, W, Ni, Pd, Pt, Au, Ag, Cu, Ti, Zr, Hf, V, Cr, Mn, Fe, Ru, Os, Co, Rh, Ir, In, Ga, Al, Zn, Cd, Tl or a combination thereof, 1 ppm<x<0.8 and
0<b<3.

2. The process according to claim 1, wherein the particles of the first phase have a characteristic length of not more than 1 μm.

3. The process according to claim 2, wherein the particles of the first phase have a characteristic length of not more than 0.1 μm.

4. The process according to claim 1, wherein the proportion of the metals or metal chalcogenides of the first phase is 5 to 60 atom%, based on the overall thermoelectric material.

5. The process according to claim 1, wherein the entire thermoelectric material is free of silver.

6. A thermoelectric material obtainable by a process according to claim 1.

7. A thermoelectric generator or Peltier arrangement comprising a thermoelectric material according to claim 6.

8. A heat pump, cooler, refrigerator, (laundry) dryer, generator for utilizing heat sources, generator for converting thermal energy to electrical energy, comprising at least one thermoelectric generator or a Peltier arrangement according to claim 7.

* * * * *